United States Patent [19]

Calhoun et al.

[11] Patent Number: 4,931,598

[45] Date of Patent: Jun. 5, 1990

[54] ELECTRICAL CONNECTOR TAPE

[75] Inventors: Clyde D. Calhoun; David C. Koskenmaki, both of St. Paul, Minn.

[73] Assignee: 3M Company, St. Paul, Minn.

[21] Appl. No.: 292,050

[22] Filed: Dec. 30, 1988

[51] Int. Cl.⁵ .............................................. H01B 7/08
[52] U.S. Cl. ........................... 174/117 F; 174/117 FF; 174/117 A
[58] Field of Search .......... 174/117 F, 117 FF, 117 A

[56] References Cited

U.S. PATENT DOCUMENTS

| | | | |
|---|---|---|---|
| 3,132,204 | 5/1964 | Giellerup | 174/117 A |
| 3,475,213 | 10/1969 | Stow | 428/328 |
| 3,497,383 | 2/1970 | Olyphant, Jr. et al. | 428/162 |
| 3,505,144 | 4/1970 | Kilduff et al. | 174/117 FF |
| 4,113,981 | 9/1978 | Fujita et al. | 174/88 R |
| 4,433,887 | 2/1984 | Sado | 174/88 R X |
| 4,460,804 | 7/1984 | Svejkovsky | 174/117 FF X |
| 4,548,862 | 10/1985 | Hartman | 428/356 X |
| 4,568,602 | 2/1986 | Stow | 428/172 |
| 4,568,602 | 2/1986 | Stow | 428/172 |
| 4,569,877 | 2/1986 | Tollefson et al. | 428/141 |
| 4,606,962 | 8/1986 | Reylek et al. | 428/172 X |
| 4,610,908 | 9/1986 | Reylek et al. | 428/141 |
| 4,659,872 | 4/1987 | Dery et al. | 174/117 A |
| 4,731,282 | 3/1988 | Tsukagoshi et al. | 428/220 |
| 4,731,503 | 3/1988 | Kitanishi | 174/117 FF X |
| 4,769,399 | 9/1988 | Schenz | 523/213 |

FOREIGN PATENT DOCUMENTS

| | | | |
|---|---|---|---|
| 660136 | 1/1964 | Italy | 174/117 A |
| 2048582A | 12/1980 | United Kingdom . | |

Primary Examiner—Morris H. Nimmo
Attorney, Agent, or Firm—Merchant, Gould, Smith, Edell, Welter and Schmidt

[57] ABSTRACT

The invention provides a sheet material adapted to make bonded electrical connection to an array of closely spaced conductive terminal pads. The material may be provided as a roll of an elongated flexible connector tape. The sheet material of the invention comprises a thin, flexible insulating substrate and a plurality of longitudinally-extending, regularly-spaced, metal conductive members. The sheet may also include an adhesive layer that may cover the conductive members or at least a portion of the conductive members may extend above the adhesive layer. The conductive members may be supported and held on the substrate or may be suspended in the adhesive, out of contact with the substrate.

23 Claims, 2 Drawing Sheets

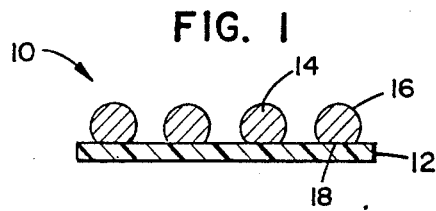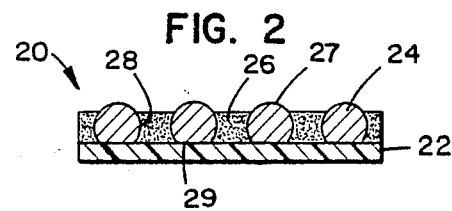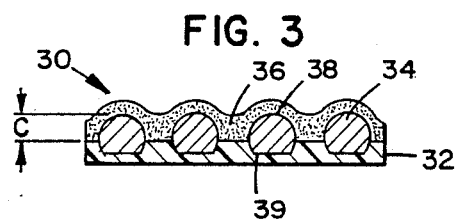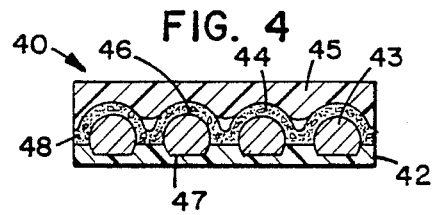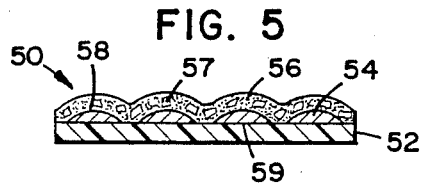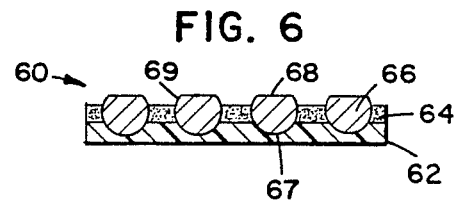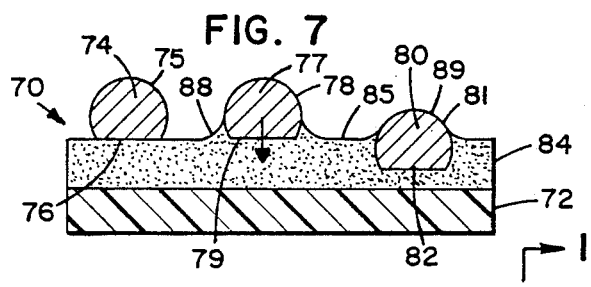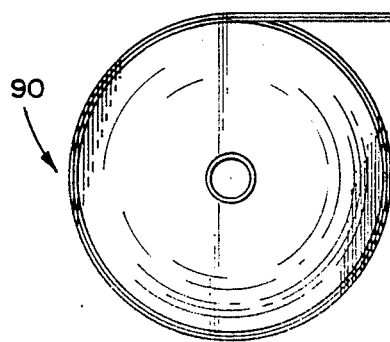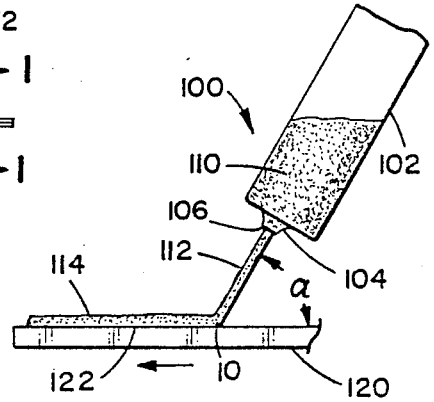

an imagery. 4,931,598

ELECTRICAL CONNECTOR TAPE

TECHNICAL FIELD

This invention relates to conductive sheet materials useful for making electrical connections between electronic components, particularly on an extremely small scale.

BACKGROUND OF THE INVENTION

In the electronic equipment and telecommunications industries there is a wide-spread need to make electrical connections between components, often on a small scale. For instance, it is necessary to make electrical connections between printed circuit boards or liquid crystal displays by connecting an array of closely-spaced, side-by-side pads, on each respective component. Electronic components are often arranged in computers or the like with extreme space restrictions. Therefore, it is often necessary for the electrical connectors to be flexible. Accordingly, flexible conductive tapes having closely spaced parallel, conductive stripes, that extend the entire length of a flexible insulated support, are in widespread use in the electronic equipment and telecommunications industries.

Known conductive tapes include conductive stripes consisting of: (a) conductive inks, (b) thin metal wires, or (c) stripes of thin metal films, e.g., deposited through a mask or selectively etched to provide the desired conductor width and spacing. Thin metal stripes, are typically covered with an anisotropic conductive adhesive to electrically connect the conductive stripes to an array of terminal pads on a printed circuit board, liquid crystal display, or the like.

There are disadvantages inherent in each of the three presently known conductive tape constructions. Conductive tapes that use conductive inks as the conductive stripes typically have a undesirably high resistance. The manufacture of conductive tapes using thin metal wires for the conductive stripes requires drawing the metal wires down to size and attaching the wires to a flexible insulating support. Known methods are typically difficult and expensive. Production of thin metal films usually requires vapor deposition. The stripes are made by either masking during vacuum deposition or by selectively etching the metal films after deposition, for example, by means of photolithographic techniques. The rate at which metal films are deposited in vacuum metalization processes often makes it economically unattractive to increase the thickness of the metal stripes to a thickness sufficient to provide the desired low resistance pathways.

In presently known electrical conductor tapes, the conductor tape is often constructed such that the spacing of the individual conductive stripes is the same as that of the terminal pads to which it is intended to be bonded. Accordingly, when the bonds are made between the conductive stripes and an array of terminal pads, it is necessary that absolute registration be maintained between the stripes and the pads during bonding. The fine pitch of many arrays of terminal pads makes such registration very difficult. Thus, it is often necessary to use magnifying devices when bonding the conductive tape to the terminals. However, if the pitch of the electrical conductors is so fine that one or more conductors will contact a terminal pad during bonding, absolute registration will not be necessary. It will still be necessary, in most applications, to maintain a generally parallel alignment to prevent cross-over connections.

Therefore, there is a need for a universal, flexible, conductive connector tape, adapted to provide electrical connection between two arrays of closely-spaced conductive pads. There is also a need for a connector tape with a plurality of conductors, regularly-spaced longitudinally in the conductive tape, having a sufficiently fine pitch so that absolute registration is not necessary in most applications. There is a further need for a conductive tape which provides low resistance paths, bonds firmly to an array of terminal pads, and is relatively simple and economical to manufacture. There is a further need for a method by which various connector tape constructions can be made, that are adapted to bond to an array of terminal pads by means of adhesive, conductive-adhesive, and/or solder bonds.

SUMMARY OF THE INVENTION

The present invention provides a sheet material adapted to make bonded electrical connections to an array of closely-spaced conductive terminal pads. The sheet material may be provided as a roll of an elongated flexible connector tape. The sheet material of the present invention comprises a thin, flexible insulating substrate and a plurality of longitudinally-extending, regularly-spaced, metal conductive members. The conductive members individually comprise fine metal strands having a cross-section with an area of about 100 to 100,000 $\mu m^2$, the cross-section having a flat portion and an arcuate portion. The flat portion of the conductive members may contact the substrate or it may lie above the surface of the substrate. The conductive members may also be partially or completely embedded in the substrate.

The sheet material may also include an adhesive layer. The adhesive layer may cover the conductive members, particularly when the adhesive is conductive, preferably anisotropically conductive. Alternatively, at least a portion of the conductive members may extend above the adhesive layer. The conductive members may be supported and held on the substrate or may be suspended in the adhesive, out of contact with the substrate.

The conductive sheet material of the present invention may be made with the conductive members having a very fine pitch. The center-to-center spacing of the conductive members is dependent on the application, and is typically less than about 500 $\mu m$, and is preferably less than about 250 $\mu m$. The method of the present invention is capable of providing center-to-center spacings of less than about 100 $\mu m$.

The present invention also provides a method of making a sheet material of the invention. The method comprises the steps of providing a thin, flexible, insulating substrate, and squirting a plurality of fine molten strands onto the substrate to form metal strands. The metal strands individually have a cross-section with an area of about 100 to 100,000 $\mu m^2$ and the cross-section having a flat portion and an arcuate portion. An adhesive or conductive adhesive, comprising an adhesive with conductive particles dispersed therein, may be coated over the metal strands. Alternatively, the adhesive may be provided on the substrate and the conductors embedded into the adhesive by pressure or heat-sinking them into the adhesive layer. "Heat-sink" as used herein means that the metal strands are deposited onto the surface of the adhesive and the adhesive is heated to a temperature of less than the melting temperature of the metal for such time that the metal strands become embedded in the adhesive layer. The degree to which the strands become embedded is dependent on the temperature and the time the adhesive is kept at the elevated temperature.

BRIEF DESCRIPTION OF THE DRAWINGS

FIG. 1 is a schematic cross-sectional view of a sheet material of the invention;

FIG. 2 is a schematic cross-sectional view of a sheet material of the invention;

FIG. 3 is a schematic cross-sectional view of a sheet material of the invention;

FIG. 4 is a schematic cross-sectional view of a sheet material of the invention;

FIG. 5 is a schematic cross-sectional view of a sheet material of the invention;

FIG. 6 is a schematic cross-sectional view of a sheet material of the invention;

FIG. 7 is a schematic cross-sectional view depicting the heat-sink process with a sheet material of the invention.

FIG. 8 is a side elevation view of a sheet material of the invention provided in roll form;

FIG. 9 is a schematic view of one step in the method of the invention depicting a metal strand being deposited onto a moving substrate.

DETAILED DESCRIPTION OF THE INVENTION

Figure 10:
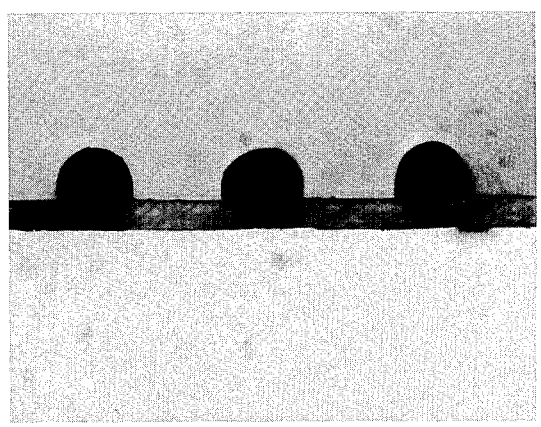
FIG. 10 is a photomicrograph of a cross-section of a sheet material of the invention.

The present invention provides a sheet material adapted to make bonded electrical connections to an array of closely spaced conductive terminal pads. The sheet material may be useful as a conductive connector tape for making electrical connections between electronic components. The sheet material comprises a thin, flexible insulating substrate, and a plurality of longitudinal-extending, regularly-spaced, metal conductive members. The conductive members can be of a predetermined arrangement to permit individual contact to a corresponding number of terminal pads, or they can be made with such a small pitch that one or more conductive members contacts each terminal pad.

The sheet material may also include an adhesive layer. Where the conductive members are made from a metal that is not capable of forming a secure solder bond to the desired array of terminal pads the adhesive layer aids in bonding the conductive members to the terminal pads.

The present invention provides several adhesive/-conductive member configurations, making several bonding mechanisms possible, including the following: (a) the adhesive layer can cover the members and be pushed from between the terminal pad and member with bonding pressure; (b) the members can extend above the surface of the adhesive so that direct metal-to-metal contact is made during bonding, with the adhesive surrounding and aiding the metal-to-metal bond with bonding pressure; and (c) a conductive adhesive layer may be disposed over the members with the electrical connection between the pad and the member made by means of the electrically conductive particles.

The adhesive layer may be coated onto the insulating substrate prior to application of the conductive members. The conductive members may be applied directly onto the surface of the adhesive layer. The conductive members may be left supported on the surface of the adhesive layer or the conductive members may be pressed into the adhesive layer, as desired. The conductive members may be partially submerged into the adhesive layer leaving an exposed portion of the conductive members extending above the surface of the adhesive layer. In addition, the conductive members may be pressed into the adhesive layer until they contact the surface of the insulative substrate. Depending on the thickness of the adhesive layer, the conductive members may contact the insulating substrate and extend above the surface of the adhesive layer. It may also be desirable to press the conductive members into the insulating substrate either before or after application of the adhesive.

Heat-sinking is an alternative method for embedding the conductive members into the adhesive layer. The conductive members are coated onto the adhesive layer and the resulting assembly is heated to soften the adhesive. The extent to which the adhesive is softened (temperature dependent) and the time the adhesive is heated, determines the extent to which the conductive members sink into the adhesive layer. Time and temperature parameters may be designed to precisely control the extent to which the members become embedded.

The present invention also provides a method by which the conductive members flat portion may extend upward from the insulated substrate to provide a flat bonding surface on the conductive member (e.g. FIG. 6). To provide such a conductive tape configuration, conductive members are deposited onto a release surface, such as a polyimide sheet material. The flat portion of the conductive members will be in contact with the polyimide sheet material. The conductive members are then transferred to the desired insulating substrate, which may also include an adhesive layer. The conductive members may be embedded into the adhesive layer and/or into the insulating substrate. As is shown in FIG. 6, the flat portion of the conductive members may lie both parallel to and above the surface of adhesive layer, thereby providing an exposed flat bonding surface.

Referring to FIG. 1, a conductive sheet material 10 is shown having an insulative substrate 12 and a plurality of conductive members 14. The conductive members 14 each have an arcuate portion 16 and a flat portion 18. The flat portion 18 contacts the insulative substrate 12.

Referring to FIG. 2, a second configuration of a conductive sheet material 20 is shown. The sheet material 20 has an insulative substrate 22, a plurality of conductive members 24, and an adhesive layer 26. The conductive members 24 each include an exposed bonding portion 27, an arcuate portion 28, and a flat portion 29.

Referring to FIG. 3, a conductive sheet material 30 is shown. The conductive sheet material 30 includes an insulative substrate 32, a plurality of conductive members 34, and an adhesive layer 36. The adhesive layer 36 is disposed over the conductive members 34. Each of the conductive members 34 include an arcuate portion 38 and a flat portion 39. The conductive members 34 are shown embedded in the insulative substrate 32. The conductive members 34 extend above the substrate 32 a distance "C".

Referring to FIG. 4, a further configuration of a conductive sheet material 40 is shown. The conductive sheet material 40 includes an insulative substrate 42, a plurality of conductive members 43, an adhesive layer 44, and a release liner 45. The conductive members 43 each includes an arcuate portion 46 and a flat portion 47. The adhesive layer 44 includes conductive particles 48.

Turning to FIG. 5, a conductive sheet material 50 is shown, having an insulative substrate 52, a plurality of conductive members 54, and an adhesive layer 56. The adhesive layer 56 includes conductive particles 57. Each of the conductive members 54 has an arcuate portion 58 and a flat portion 59.

Referring to FIG. 6 a conductive sheet material 60 is shown. The conductive sheet material 60 includes an insulative substrate 62, an adhesive layer 64, and a plurality of conductive members 66. The conductive members 66 each includes an arcuate portion 67, a flat portion 68, and an exposed bonding portion 69. The conductive members 66 are provided in their inverted position relative to the conductive members of FIGS. 1-5, for example, by transferring the conductive members from a release surface.

Referring to FIG. 7, a schematic cross-section of a conductive sheet material 70 having an insulative substrate 72 and conductive members 74, 77, and 80, is shown. Each of the conductive members includes an arcuate portion, 75, 78, and 81, and a flat portion 76, 79, and 82, respectively. The conductive sheet material 70 also includes an adhesive layer 84 having a top surface 85. The conductive member 74 is shown as deposited on the surface 85 with the flat portion 76 in contact with the surface 85. Conductive member 78 is shown with a meniscus 88 contacting the arcuate portion 78. The meniscus 88 will form as the adhesive 84 is heated and the conductive member 78 begins to sink. The conductive member 80 is shown embedded in the adhesive layer 84 with the flat portion 82 and a portion of the arcuate portion 81 embedded in the adhesive layer 84, and an exposed bonding portion 89 extending above the surface 85.

Referring to FIG. 8, a roll of conductive tape 90 is shown.

Referring to FIG. 9, a step in the method of the present invention is shown. A metal dispenser generally designated 100 having a vessel portion 102, and a nozzle portion 104 with an orifice 106, is shown. The vessel 102 of the dispenser 100 contains a molten metal 110. The molten metal 110 is squirted through the orifice 106 in the form of a molten metal stream 112. A substrate 120 moving in the direction of the arrow, is moved past the orifice 106 to provide a thin metal strand 114 on a substrate surface 122. The angle between the stream 112 and the substrate surface 122 has been designated alpha.

Referring to FIG. 10, a photomicrograph (200X magnification) of pure tin conductive members deposited on a 25 μm polyethylene terephthalate (PET) substrate, is shown.

Figure 11:
FIG. 11 is a photomicrograph of conductive members of the invention.

Referring to FIG. 11, a photomicrograph (50x magnification) depicting pure tin conductive members deposited on a 25 μm film of PET is shown.

Metals

A wide variety of metals may be used. Examples of preferred metals for use in the conductive sheet materials of the present invention include tin, lead, bismuth, zinc, indium, aluminum, their alloys (including alloys of these metals with metals of higher melting points, such as, copper, silver, gold, nickel, cobalt, iron), and mixtures thereof. In addition, the conductivity may be increased by coating the members with a higher conductivity metal such as copper, gold, silver, nickel, cobalt or platinum by, for example, electroplating.

The metals, metal alloys, or mixtures of metals and metal alloys, are preferably utilized in a substantially pure form. It is unnecessary, and often undesirable, to include polymeric binders which are found, for example, in metal inks, or other fillers or additives. The metal is applied in a molten state through a fine orifice, such as a capillary or needle. Therefore, it is preferable that the metal not include substances that could clog or otherwise hamper the application of the typically fine strand of metal, which is applied to the surface of the insulating substrate.

The metal is substantially undrawn when it solidifies from the molten state in which it is applied to the substrate. This is in contrast to metal wires commercially available on spools; such wires are typically drawn or stressed during processing.

The fine metal strands are deposited in a molten state onto a substrate. Thus, a flat portion is formed where the molten member meets the substrate. Also an arcuate portion extends upward from the flat portion. The arcuate portion of the cross-section of the conductive members will not necessarily represent an exact portion of a circle. It may be skewed, imperfect, out of alignment, etc. However, the surface tension properties of the molten metal will cause the conductive members to have a portion, extending from the substrate on which they were deposited, that has a perimeter which roughly approximates a portion of a circle. The flat portion will contact the surface on which it is deposited (e.g. FIGS. 1,2,5,7). When the members are transferred from the surface on which they are deposited, the flat portion of the members faces away from the new substrate (FIG. 6).

Insulating Substrates

The electrically insulating substrates of the present invention are preferably flexible, and are typically about 25 to 1000 μm thick, preferably 25 to 250 μm thick. The sheet may comprise a polymeric film or a number of thin insulating substrates, such as a resin-impregnated fibrous web.

Suitable polymer films for use in the composite of the present invention include polyamides; polyolefins, including polymers and copolymers of ethylene, propylene, methylpentene and blends thereof; polyurethanes; polysulfones; polycarbonates; linear polyester, such as polyethylene terephthalate (PET) and polybutlyene terephthalate; cellulose esters, such as cellulose acetate, and cellulose propionate; halogenated polyolefins; polyacetals; ABS (acrylonitnitrile butadiene styrene) resins; polyphenylene oxide plus styrene resin (Noryl); the alkenyl aromatic resins typified by polystyrene, styrene copolymers, blends and graft copolymers; and the alkenyl aromatic resins typified by polystyrene copolymers. Also included in the term polymer are blends of copolymers of two or more polymeric materials. Preferred films include PET, such as Mylar (Dupont) or Scotchpar (3M), or polyimide films.

In some instances, the insulative substrate will comprise an adhesive film that acts as both the substrate and adhesive to aid in bonding.

Adhesives

A wide range of adhesives may be used in conjunction with connector tapes of the present invention, whether pressure-sensitive adhesives, thermoplastic adhesives, or a thermoset adhesive in a thermoplastic state (e.g. a B-stage epoxy).

The adhesive should be flowable at a temperature less than the melting point of the metal. Where the adhesive is tacky at ambient temperature, it is desirable to use a release liner to cover the adhesive.

One example of a suitable adhesive, known as "hot tackifying" adhesive, is described in U.S. Pat. No. 4,569,877. This adhesive material is described as non-tacky or poorly tacky at 20° C, but becomes pressure-sensitive and aggressively tacky when heated. Good bonds are immediately formed at a tackifying temperature without any need for crosslinking or other chemical reactions. The adhesive material comprises an acrylic polymer or mixture of acrylic polymers of at least one alkyl acrylate and/or methacrylate ester monomer (here called "acrylic ester monomer"), and has the following characteristics and components:

(1) the acrylic ester monomer provides at least 50 mole percent of the one or more acrylic polymers of the adhesive layer, (2) the one or more acrylic polymers have a $T_g$ of $-10°$ to $80°$ C., (3) a layer of the adhesive material has:

(a) a Probe Tack Value[1] of less than 75 grams of force (gf) at 20° C., (b) Probe Tack Values of at least 75 gf over a range of at least 50° C, which values remain substantially constant after 30 days at 40° C., and (c) a Shear Value[1] of at least 25 minutes at 65° C., and (4) up to 50 mol percent of the one or more acrylic polymers can be provided by copolymerizable monomer having a polar group, such as acrylic acid, methacrylic acid, itaconic acid, maleic acid or anhydride, the amides of said acids, acrylonitrile, methacrylonitrile, and N-vinyl-2-pyrolidone.

See Col. 3-4, U.S. Pat. No. 4,568,602.

The one or more acrylic polymers may be a homopolymer of an acrylic ester monomer which provides a $T_g$ within the range of $-10°$ to $80°$ C., e.g., methyl acrylate, or a copolymer or acrylic ester monomer and copolymerizable polar monomer having a $T_g$ within that range. Useful acrylic ester monomers which homopolymerize to a $T_g$ of at least $-10°$ C. include methyl acrylate, methyl methacrylate, ethyl methacrylate, propyl methacrylates, butyl methacrylates, bornyl acrylates, bornyl methacrylates, 2-phenoxyethyl acrylate, 2-phenoxyethyl methacrylate, the mono- and di-methyl and ethyl esters of itaconic acid, and the mono- and di-methyl and ethyl esters of maleic acid. Useful acrylic ester monomers which provide reduced $T_g$ include ethyl, butyl, and octyl acrylates, and n-amyl, hexyl and octyl methacrylates.

The described hot tackifying adhesive material becomes pressure-sensitive and aggressively tacky when heated, typically for use in this invention, to a temperature of about 40° C., or above, and preferably 75° C. or above. When later subjected to temperatures at or even above the bonding temperature, adequate bonding strength may be retained. Electrically conductive particles may be dispersed into the adhesive material to form a conductive bond, and the particles and adherents tend to be retained in their bonded position by the firm adhesive material at elevated temperatures as well as room temperature.

Other copolymerizable monomers may also be employed in small amounts. Among such copolymerizable monomers are styrene, vinyl acetate and vinyl chloride, each of which can be used in amounts up to about 5 mol percent of the total monomers.

Bonds exhibiting the best durability during prolonged exposure to high humidity (e.g. 95% RH) at elevated temperatures (e.g. 80° C.) are obtained with hot tackifying acrylic adhesives in which the acrylic polymer has an interacted functionally reactive organosilane coupling agent in an amount of at least 0.2 part per 100 parts by weight of total monomer. Best results are attained at about 0.5 to 4 percent.

The organosilane may be interpolymerized with the acrylic ester monomer, with or without other copolymerizable monomers, or it may be reacted with functional groups on the backbone of an acrylic polymer. Either process results in what is hereinafter called an "acrylic-silane interpolymer."

The organosilane has the general formula $R_{(4-n)}SiX_n$ where X is a hydrolyzable group such as ethoxy, methoxy, or 2-methoxy-ethoxy; R is a monovalent organic radical of from 1 to 12 carbon atoms which contains a functional organic group such as mercapto, epoxy, acrylyl, methacrylyl, or amino; and n is an integer of from 1 to 3.

As is known in the art, the organosilane can cause solutions of polymers to gel, so that it may be desireable to employ an alcohol or other known stabilizers. When the organozilane is to be copolymerized with the other monomer, a stabilizer should be selected that does not interfere with the polymerization. Methanol is especially useful and is preferably employed in amounts from about twice to about four times the amount of the organosilane.

Other heat-activated adhesive materials that can be used are hot-melt adhesive materials, which are typically thermoplastic materials that soften to a flowable state and then cool to form an adhesive bond, and reactive compositions, such as epoxy-based adhesives. A suitable epoxy adhesive is described in U.S. Pat. No. 4,769,399.

The conductive particles in the illustrative sheet material of the invention shown in FIGS. 4 and 5 can be of a wide variety of sizes and shapes as well as material variations. It is preferred that the conductive adhesives are anisotropic in electrical conduction after the bond has been made so as to prevent electrical shorting between adjacent conductors. Some conductive transfer adhesives consist of a reasonably uniform distribution of conductive particles in the adhesive before bonding but obtain their electrical anisotropic characteristic during bonding in that the adhesive between the conductors on the tape and the terminal pads is reduced in thickness until the particles are able to make an electrical connection; the adhesive in other regions is not reduced in thickness and remains insulative. An example of this type of conductive adhesive is explained in U.S. Pat. No. 4,731,282 (Tsukagoshi et. al.). An example of electrically anisotropic adhesives are those which have chains of magnetically oriented conductive particles which extends through the adhesive thickness; U.S. Pat. No. 4,548,862 (Hartman). Another example of useful electrically anisotropic adhesives are those which have conductive particles which have a diameter which approximates the thickness of the adhesive and where such particles are arranged so as to not touch one another. Examples of these types of electrically anisotropic adhesives are U.S. Pat. No. 3,475,213 (Stow) and U.S. Pat. No. 4,606,962 (Reylek et. al.)

Flattened particles are useful because they tend to lie on their flattened side, and a high percentage of the particles participate in electrical conduction through the adhesive layer in an adhesive bond. Spherical particles are especially desirable, particularly when screened within narrow size ranges so that a high percentage of the particles are of about the same size. The particles should be sufficiently firm or rigid so as to penetrate through the adhesive layer (i.e. 56 in FIG. 5; 48 in FIG. 4) during a bonding operation. Some deformation of the particles may occur during the bonding operation, e.g., by pressure against a rigid substrate. The particles are usually metal, preferably silver, but alternatively copper or aluminum (for which additives as described in U.S. Pat. No. 3,475,213 are desirable to achieve compatibility), or various other metals metalized particles such as glass beads, carbon particles, etc. Also, electrically conductive elements may take the form of material embossed from a conductive backing, such as the embossed protrusions from a metal foil taught in U.S. Pat. No. 3,497,383. The electrically conductive element may also comprise small particles clustered closely together.

The particles can range in thickness from about 1 to 500 $\mu$m, although the preferred range for presently contemplated products is about 1 to 100 $\mu$m. It is preferable that the particles have a thickness near or greater than the thickness of the adhesive layer.

Method of Making

The present invention also includes a method for making a sheet material adapted to make bonded connections to a substrate. The sheet materials are useful as a conductive tape that is adapted to bond arrays of closely spaced conductive terminals to each other.

In general terms, the method of the invention comprises the steps of: (a) providing a thin flexible insulating substrate; and (b) squirting a plurality of molten metal strands onto the substrate to form the conductive members.

The sheet material may also include an adhesive layer. The adhesive layer can be either thicker or thinner than the thickness of the conductive members. The conductive members can extend from the adhesive layer or the adhesive layer can be coated over the conductive members. Where it is desirable to have the conductive members extending from the adhesive layer, the adhesive can be coated directly onto the insulating substrate. The molten metal strands are then squirted through a plurality of orifices onto the adhesive. The conductors may be left on the top surface of the adhesive layer. When bonding to raised terminal pads the adhesive is forced up and around the conductive members and terminal pads to aid in bonding.

Alternatively, the conductors may be sunk into the adhesive layer through pressure or heat sinking. Preferably, the conductive members are partially sunk into the adhesive layer leaving a portion of the conductive members extending from the surface of the adhesive. In this configuration (i.e. exposed conductive members) the metal conductive members of the connector tape contact the terminal pads directly to form metal to metal contact, without an insulating layer of adhesive interfering with the electrical connection. A removable insulating liner may be used to cover the conductive members so as to prevent shorting along the length of the electrical connector tape. In another contruction, the insulating substrate can be eliminated and an adhesive film can function as both substrate and an adhesive to aid in bonding. Such a construction would permit establishing electrical connections between terminal pads on either or both sides of the electrical connector tape and one or more of the fine metal strands.

The fine metal strands can have a cross section that is greater or less than the thickness of the adhesive layer and they may either extend above the surface of the adhesive or be completely embedded in the adhesive layer. When the conductive members extend above the surface of the adhesive an insulating liner may be used. The insulating liner prevents electrical shorting along the length of the tape and is removed in those regions where connections to terminal pads are made. In this construction, where an adhesive layer also functions as the insulating substrate, it is preferred that the adhesive not contain conductive particles.

The invention will be further described by the following non-limiting examples.

Example 1

A conductive sheet material of the invention was made as follows: a 1.4 cm diameter by 46 cm long quartz glass tube was melted at one end and pulled to form a capillary orifice with an internal diameter (I.D.) of 50 $\mu$m. In the process, the capillary end of the tube was bent at right angles near the orifice. The tube was then filled to a depth of about 14 cm with molten tin and pressurized to 344 kPa. The quartz tube was mounted on the tool carriage of a lathe and a piece of PET, 20 cm by 46 cm by 25 $\mu$m (thick), was taped to a 15 cm diameter aluminum mandrel which was mounted in the lathe. The mandrel was spun at 1400 rpm (surface speed of 11.2 m/sec) and the nozzle was swept longitudinally while squirting a 3 mm long jet of molten tin at an impingement angle (alpha) of 20°. The carriage and quartz tube were swept at a rate which gave a line spacing of 138 $\mu$m. The conductive lines were roughly 50 $\mu$m wide. The resulting composite of parallel tin conductive members on a PET substrate provided an electrical connector tape with conductive members each having an average electrical resistivity of 0.7 ohms/cm for each line and a line spacing of 72 lines/cm.

Example 2

A conductive sheet material of the invention was made in a manner identical to Example 1 except that the molten tin metal was deposited directly on the adhesive side of a 5 cm by 46 cm piece of pressure sensitive adhesive tape, type 355, commercially available from 3M Co., St. Paul, MN. This composite of parallel tin lines on a pressure sensitive adhesive provides an electrical connector tape which can be bonded to an array of terminal pads by simply applying bonding pressure to the tape in contact with the array at room temperature.

Example 3

A conductive tape of the invention was prepared in a manner identical to Example 1 except that the insulative substrate was a piece of 15 cm by 30 cm by 125 $\mu$m Teflon ® (commercially available from DuPont). The line spacing was 18 lines/cm. The side of the Teflon film with the metal lines was knife coated with a liquid consisting of 23 grams of an acrylic polymer type XHTA, manufactured by Rohm Haas Company, dissolved in 60 grams of dimethylformamide. The acrylic-dimethylformamide solution was coated to a thickness of 125 μm. The sample was placed in a oven set to 90° C. for one hour to evaporate the dimethylformamide solvent. After removing the solvent in this way, the acrylic coating was stripped from the Teflon and, in the process, the tin lines were also stripped from the Teflon and remained embedded in the acrylic with the arcuate portions of the conductive members embedded in the substrate and the flat portions exposed. In this way a connector tape was formed consisting of an acrylic film with embedded parallel conductors of fine metal strands.

Example 4

A conductive tape of the invention was made by depositing parallel tin lines in a manner identical to Example 1, except that the substrate onto which the lines were deposited was a piece of cast PET (15 cm by 46 cm by 125 μm). The sample was then hot rolled by passing it between two 15 cm diameter by 40 cm long heated steel rolls. The rolls were at a temperature of 150° C. and were hydraulically pressed against one another with a force of roughly 91 kg. The rolls were operated at a rolling speed of 61 cm/min. To keep the PET from sticking to the rolls, the PET was sandwiched between two pieces of 1 mil thick polyimide, which were later peeled from the polyester after the polyester had cooled back to room temperature. In this way the parallel metal conductors were embedded into the polyester to provide improved adhesion of the conductors to the substrate.

Example 5

A conductive tape of the invention was made using the procedures and equipment detailed in Example 1. An alloy of 58 weight percent Bi and 42 weight percent Sn was heated to 250° C. and squirted out of a 125 μm I.D. orifice in a quartz tube. The metal was deposited onto the high gloss side of a SCOTCHCAL® release liner available from the 3M Co., St. Paul, MN. The molten metal was pressurized to 250 kPa with argon gas. The relative speed between the orifice and the release liner was 0.75 meters per second. In order to match the spacing available in printed circuit test boards, the metal was deposited at 7.9 lines per centimeter. The parallel metal conductors were transferred to a sheet of EAA-PET (50 μm polyethylene and acrylic acid copolymer hot melt adhesive on a carrier film of 50 μm of PET) by pressing the EAA-PET sheet against the metal lines and heating the sheet with a hand held iron (150° C.) to soften and tackify the hot melt adhesive. The release liner was removed after cooling. The resulting composite of the parallel metal lines embedded in the EAA-PET sheet formed an electrical conductor tape of this invention.

The above described tape was used as a jumper to bond discontinuous conductors or electrodes of matched spacing on printed circuit test boards. The parallel conductors were 0.625 mm wide and had a 1.25 mm center-to-center spacing. The electrode strips of the printed circuit test boards and the electrical connector tape were aligned and bonded together in a press at 100° C. for 15 sec under a pressure of 1400 kPa.

Of the electrode pairs thus interconnected, the ohmic resistance of each of 12 pairs was tested at room temperature by applying a DC current of 0.1 milliamperes at less than 1.2 volts. The ohmic resistances of each of the twelve connections was 1.4 ohms. (The resistances reported are actually twice the resistance per connection since the circuit extends through two connections per measurement, i.e. the electrical connector tape serves as a jumper for the discontinuous parallel conductors on the printed circuit test board).

Example 6

A conductive sheet material of the invention was made using the same alloy, temperature, and apparatus of Example 5. Parallel metal conductors were deposited on a 50 μm thick, biaxially oriented PET film. In this example, multiple passes were used at offsets (about 200 μm) in order to make wider and heavier conductors. Bonding was accomplished by using two bonding cycles of 180° C. for 15 seconds at a pressure of 1400 kPa. Since an adhesive was not used, bonding resulted from a metal-to-metal bond, as in solder bonding. Resistance measurements were made as in Example 5 and are reported in Table 1.

TABLE 1

| Connection | Resistance (Ohms) | Connection | Resistance |
|---|---|---|---|
| 1 | 0.6 | 7 | 0.7 |
| 2 | 0.6 | 8 | 0.6 |
| 3 | 0.6 | 9 | 0.7 |
| 4 | 0.6 | 10 | 0.7 |
| 5 | 0.6 | 11 | 0.7 |
| 6 | 0.6 | 12 | 0.7 |

Example 7

Conductive tape was made as described in Example 6, except that a conductive transfer adhesive (RATS, commercially available from 3M Co., St. Paul, MN.) was used to form the bond between the electrical connector tape and the printed circuit test boards. A bond cycle of 180° C. for seconds at a pressure of 140 KPa was used. Resistance measurements were made as in Example 5 and are reported in Table 2.

TABLE 2

| Connection (Ohms) | Resistance (Ohms) | Connection | Resistance |
|---|---|---|---|
| 1 | 0.6 | 7 | 0.6 |
| 2 | 0.6 | 8 | 0.6 |
| 3 | 0.6 | 9 | 0.6 |
| 4 | 0.6 | 10 | 0.6 |
| 5 | 0.6 | 11 | 0.6 |
| 6 | 0.6 | 12 | 0.6 |

What is claimed is:

1. A sheet material adapted to make bonded electrical connections to an array of closely spaced conductive terminal pads comprising:
   (1) a thin, flexible insulating substrate; and
   (2) a plurality of longitudinally extending, regularly spaced, metal conductive members, supported and held on the insulating substrate, said members individually comprising a fine metal strand having a cross-section with an area of about 100 to 100,000 $\mu m^2$, said cross-section having a flat portion and an arcuate portion.

2. The sheet material of claim 1 wherein said flat portion contacts said substrate.

3. The sheet material of claim 1 wherein said arcuate portion contacts said substrate.

4. The sheet material of claim 1 wherein said insulating substrate is an adhesive.

5. The sheet material of claim 1 further including an adhesive layer, disposed over said substrate, said conductive members embedded in said adhesive layer.

6. The sheet material of claim 5 wherein said adhesive layer has a thickness of less than the thickness of said conductive members, with at least a portion of said conductive members extending from the surface of said adhesive layer, providing a plurality of exposed bonding portions.

7. The sheet material of claim 5 where said adhesive layer has a thickness of greater than the thickness of said conductive members, with said conductive members covered by said adhesive layer.

8. The sheet material of claim 7 wherein said adhesive is a conductive adhesive.

9. The sheet material of claim 8 wherein said adhesive is an anisotropically conductive adhesive.

10. The sheet material of claim 5 wherein said conductive members extend above the surface of said adhesive layer, but do not contact said insulating substrate, said conductive members being suspended in said adhesive layer.

11. The sheet material of claim 10 wherein said flat portion is exposed above the surface of said adhesive layer.

12. The sheet material of claim 1 wherein said plurality of conductive members are at least partially embedded in said substrate, with said conductive members extending above the surface of said substrate a distance C.

13. The sheet material of claim 12 further including an adhesive layer, said adhesive layer having a thickness of less than C, with at least a portion of said conductive members extending from the surface of said adhesive layer, providing a plurality of exposed bonding portions.

14. The sheet material of claim 13 wherein said flat portion is exposed above the surface of said adhesive layer.

15. The sheet material of claim 11 wherein said adhesive layer has a thickness greater than the thickness of said conductive members, with at least a portions of said conductive members extending from the surface of said adhesive layer, providing a plurality of exposed bonding portions.

16. The sheet material of claim 1 wherein said insulating substrate is an elongated polymeric film having a thickness of about 25 to 1000 $\mu$m.

17. The sheet material of claim 16 wherein said insulating substrate has a thickness of about 25–250 $\mu$m.

18. The sheet material of claim 1 wherein said conductive members have a center-to-center spacing of less than about 500 $\mu$m.

19. The sheet material of claim 18 wherein said conductive members have a center-to-center spacing of less than about 250 $\mu$m.

20. The sheet material of claim 19 wherein said conductive members have a center-to-center spacing of less than about 100 $\mu$m.

21. The sheet material of claim 1 wherein said conductive members comprise a metal selected from a group consisting of tin, lead, bismuth, zinc, indium, aluminum, their alloys including metals selected from the group consisting of copper, silver, gold, nickel, cobalt, and iron.

22. The sheet material of claim 1 wherein said conductive members are coated with metals selected from the group consisting of copper, gold, silver, nickel, cobalt, and platinum.

23. The sheet material of claims 1, 4, or 7 wound upon itself in the form of a roll.

* * * * *

UNITED STATES PATENT AND TRADEMARK OFFICE
CERTIFICATE OF CORRECTION

PATENT NO. : 4,931,598
DATED : June 5, 1990
INVENTOR(S) : Clyde D. Calhoun and David C. Koskenmaki It is certified that error appears in the above-identified patent and that said Letters Patent is hereby corrected as shown below:

Front page, assignee: "3M" should be --Minnesota Mining and Manufacturing Company--

Column 6, line 53: "polyester" should be --polyesters--

Column 7, line 42: "See" should be --$^1$See--

Column 8, line 30: "desireable" should be --desirable--

Column 8, line 32: "organozilane" should be --organosilane--

Column 9, line 54: "orfices" should be --orifices--

Column 14, line 8: "portions" should be --portion--

Signed and Sealed this

Twenty-eighth Day of April, 1992

Attest:

HARRY F. MANBECK, JR.

*Attesting Officer*     *Commissioner of Patents and Trademarks*